United States Patent
Farrow et al.

(10) Patent No.: US 7,518,868 B2
(45) Date of Patent: Apr. 14, 2009

(54) APPARATUS, SYSTEM, AND METHOD FOR EFFICIENT HEAT DISSIPATION

(75) Inventors: Timothy Samuel Farrow, Cary, NC (US); Dean Frederick Herring, Youngsville, NC (US)

(73) Assignee: International Business Machines Corporation, Armonk, NY (US)

( * ) Notice: Subject to any disclaimer, the term of this patent is extended or adjusted under 35 U.S.C. 154(b) by 205 days.

(21) Appl. No.: 11/364,321

(22) Filed: Feb. 28, 2006

(65) Prior Publication Data

US 2007/0201206 A1 Aug. 30, 2007

(51) Int. Cl.
*H05K 7/20* (2006.01)

(52) U.S. Cl. .................. 361/700; 361/704; 174/16.3

(58) Field of Classification Search .......... 361/700, 361/704; 174/16.3; 165/80.3, 104.26, 104.31, 165/86; 428/32.69
See application file for complete search history.

(56) References Cited

U.S. PATENT DOCUMENTS

| | | | |
|---|---|---|---|
| 5,283,715 A | 2/1994 | Carlsten et al. | 361/702 |
| 5,586,462 A * | 12/1996 | Takeuchi et al. | 72/150 |
| 6,374,905 B1 | 4/2002 | Tantoush | 165/80.3 |
| 6,717,813 B1 | 4/2004 | Garner | 361/700 |
| 6,883,594 B2 | 4/2005 | Sarraf et al. | 165/104.33 |
| 6,896,039 B2 | 5/2005 | Dussinger et al. | 165/104.26 |
| 6,978,828 B1 * | 12/2005 | Gunawardana | 165/104.26 |
| 7,056,017 B2 * | 6/2006 | Daniel et al. | 378/200 |
| 7,071,408 B2 * | 7/2006 | Garner | 174/16.3 |
| 2004/0052052 A1 * | 3/2004 | Rivera | 361/700 |
| 2004/0112572 A1 * | 6/2004 | Moon et al. | 165/104.21 |
| 2005/0217826 A1 * | 10/2005 | Dussinger et al. | 165/104.26 |
| 2005/0270744 A1 * | 12/2005 | Farrow et al. | 361/704 |
| 2007/0178255 A1 * | 8/2007 | Farrow et al. | 428/32.69 |

* cited by examiner

*Primary Examiner*—Jayprakash N Gandhi
*Assistant Examiner*—Courtney L Smith
(74) *Attorney, Agent, or Firm*—Kunzler & McKenzie (57) ABSTRACT

An apparatus, system, and method are disclosed for efficient heat dissipation. The apparatus for efficient heat dissipation is provided with a compliant heat pipe configured to conform to adjacent surfaces under a compressive load, a compression member configured to apply the compressive load to the compliant heat pipe, and wherein the compliant heat pipe conforms to the surface of the compression member and the surface of a heat source under the compressive load. Beneficially, such an apparatus, system, and method would provide efficient heat dissipation through effective thermo-coupling between the heat source and the heat pipe. Additionally, the apparatus, system, and method would facilitate the application of a load to thermal grease for further improvements on thermo-coupling between the heat source and the heat pipe.

20 Claims, 5 Drawing Sheets

APPARATUS, SYSTEM, AND METHOD FOR EFFICIENT HEAT DISSIPATION

BACKGROUND OF THE INVENTION

1. Field of the Invention

This invention relates to dissipation of thermal energy generated by an electronic component and more particularly relates to thermal conduction interfacing.

2. Description of the Related Art

One of the primary problems encountered in electronics design is excess thermal energy generated by inefficiencies in the electronic components. For example, as current flows through electric circuitry, some of the electric energy is converted to thermal energy through inefficiencies in the circuit components. Unless the excess thermal energy is dissipated, the electronic components may become increasingly inefficient. The increased inefficiency generates additional thermal energy, and the cycle continues until the component fails.

For example, in an electrical transistor, heat is generated as current flows from one gate of the transistor to another. The heat is generated by inefficiencies in the transistor. Such inefficiencies may include impurities in the silicon, imperfect electron doping, and certain inefficiencies are unavoidably inherent in the device structure and material. As heat is generated, the transistor becomes more and more inefficient, and may eventually fail due to a thermally induced current runaway.

Heat issues are particularly critical in microelectronic circuit packages, such as computer processor chip packages. These microelectronic circuit packages may contain thousands of transistors and other electronic components within a confined space. Additionally, these circuits are typically enclosed in a single chip package for protection and modularity. Consequently, these processor chip packages may reach temperatures of well over 100 degrees Fahrenheit within minutes of operation. Obviously, without a highly efficient method of dissipating the heat generated in such circuits, these microelectronic chip packages would fail to operate properly.

Electronics designers have implemented several different methods of heat dissipation in electronic components. These methods include the use of fans and enclosure venting, heatsink devices, liquid cooling, and the like. However, improvements in electronic technology make possible higher processing speeds and more components within a smaller space. These improvements, while beneficial, complicate the task of heat dissipation. Many of the smaller components are more sensitive to heat. Since more components can be placed in a smaller space, the heat generated is greater. Therefore, the need for improved heat dissipation is ever increasing.

One further method for dissipating heat generated by a heat source includes the use of heat pipes. Heat pipes are typically embodied as a rigid metal tube sealed with a thermally conductive fluid. Typically the heat pipes are filled with water, thermal grease, or other fluid exhibiting a high thermal energy potential. As the fluid is heated by the heat source, it begins to circulate within the heat pipe. In certain instances, the fluid may turn to vapor. As the fluid and vapor circulate, heat is carried from the heat source to a peripheral location. In some systems, the heat pipe carries heat to a set of heat sink fins or to a fan.

As the need to dissipate heat has increased, heat pipes have also been integrated within heat sink devices to further increase the heat dissipation performance of the heat sink. One problem encountered with such integrations is that there is an inefficient thermal coupling between the heat source and the heat pipe through the heat sink surface.

Figure 1A:
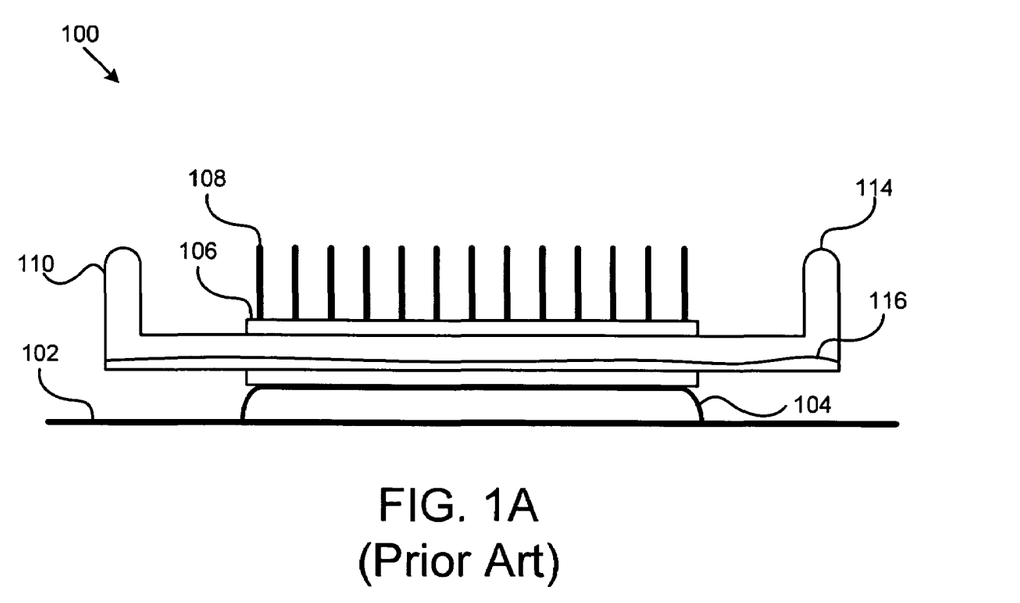
FIG. 1A is a cross-sectional side view of an integrated heat dissipating device of the prior art.

FIG. 1A is a cross-sectional side view of an integrated heat dissipating device 100 of the prior art. The integrated heat dissipating device 100 typically includes one or more heat pipes 110 integrated with a heat sink 106. The heat sink usually includes several fins 108 for dissipating heat to the ambient atmosphere. The bottom surface of the heat sink 106 typically interfaces with the top surface of a heat source 104. The heat source 104 is often a processor chip or other electronic chip package mounted on a circuit board 102. Generally, the heat pipe 110 includes sealed ends 114. The sealed ends 114 enclose a liquid 116 for liquid cooling within the heat pipe 110.

Figure 1B:
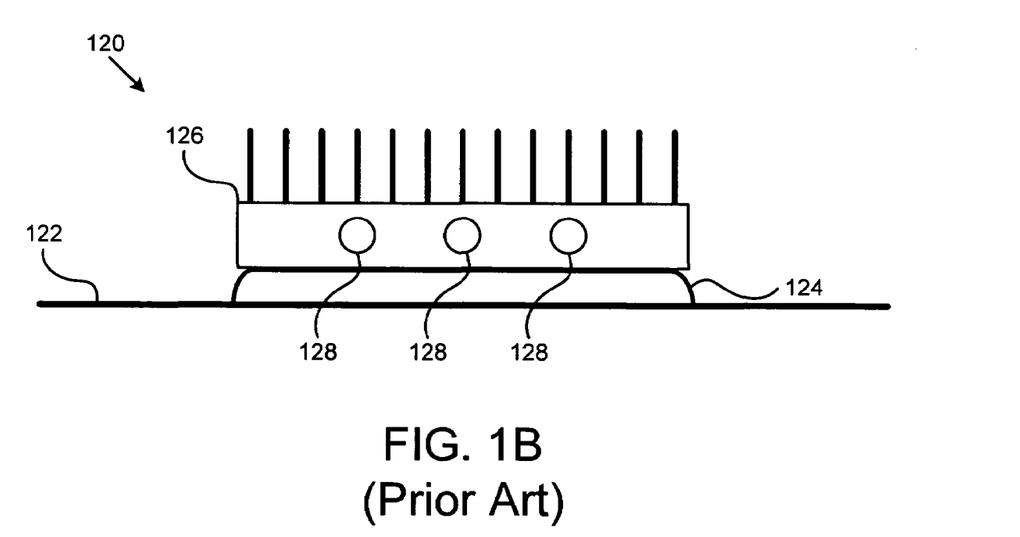
FIG. 1B is a cross-sectional front view of an integrated heat dissipating device of the prior art.

FIG. 1B is a cross-sectional front view of an integrated heat dissipating device 120 of the prior art. Although the integrated heat dissipating device 120 of the prior art may only include a single heat pipe 128 or multiple integrated heat pipes 128. The heat pipes 128 typically have a round cross-section. The integrated heat dissipating device 120 typically includes one or more heat pipes 128 integrated into the body of a heat sink 126. The heat sink 126 typically pulls heat away from a heat source 124 at the interface between the heat source 124 and the heat sink 126. The heat source 124 is typically mounted on a circuit board 122.

The primary problem with the configurations illustrated above is that the heat pipe 110 does not have direct contact with the heat source 104, so the heat pipe 110 does not efficiently cool the heat source 104. Instead, the heat pipe 110 cools only the heat sink 106, however a significant amount of heat may build up at the heat sink to heat source interface. Heat may also gather in the fins 108 or in other portion so of the heat sink 106 that are not in direct contact with the heat pipe 110.

In such systems, the heat pipe typically comprises a rigid material and configured with a round cross-section. The round cross-section is inefficient for capturing heat generated by the heat source, because there is a small surface area presented at the interface between the heat source to heat pipe interface. Round cross-sections additionally create air gaps when the heat pipe is not integrated with a heatsink. These air gaps further restrict thermal coupling efficiency. Thermal grease may be used to fill the air gaps; however it is necessary to apply a compressive load to the thermal grease for efficient thermal conduction. Since the heat pipe is a rigid body, it is difficult to apply an adequate load on the thermal grease.

From the foregoing discussion, it should be apparent that a need exists for an apparatus, system, and method that facilitate a more efficient thermal interface between a heat source and a heat pipe. Beneficially, such an apparatus, system, and method would provide efficient heat dissipation through effective thermo-coupling between the heat source and the heat pipe. Additionally, the apparatus, system, and method would facilitate the application of a load to thermal grease for further improvements on thermo-coupling between the heat source and the heat pipe.

SUMMARY OF THE INVENTION

The present invention has been developed in response to the present state of the art, and in particular, in response to the problems and needs in the art that have not yet been fully solved by currently available heat dissipation devices. Accordingly, the present invention has been developed to provide an apparatus, system, and method for efficient heat dissipation that overcome many or all of the above-discussed shortcomings in the art.

The apparatus for efficient heat dissipation is provided with a compliant heat pipe configured to conform to adjacent surfaces under a compressive load, a compression member configured to apply the compressive load to the compliant heat pipe, and wherein the compliant heat pipe conforms to the surface of the compression member and the surface of a heat source under the compressive load.

In one embodiment, the compliant heat pipe is further configured to facilitate application of the compressive load to heat transfer grease at the interface of the heat source and the compliant heat pipe. In a further embodiment, the compliant heat pipe further comprises a substantially octagonal pipe. Additionally, the compliant heat pipe may be further configured to conform to the surface of the compression member and the surface of a heat source taking on a substantially rectangular cross-section when under the compressive load. The compliant heat pipe may be further configured to substantially return to an original shape when the compressive load is released.

In one embodiment, the compressive member is further configured to apply the compressive load to the compliant heat pipe across interface area between the compliant heat pipe and the heat source. In an additional embodiment, the compliant heat pipe is configured to contain a fluid configured to circulate heat within the compliant heat pipe.

A system of the present invention is also presented for efficient heat dissipation. In one embodiment, the system includes a heat source, a heat sink configured to dissipate heat generated by the heat source, and a compliant heat pipe assembly comprising a compliant heat pipe configured to conform to adjacent surfaces under a compressive load a compression member configured to apply the compressive load through a heat sink interface surface to the compliant heat pipe wherein the compliant heat pipe conforms to the heat sink interface surface and the surface of a heat source under the compressive load.

A method of the present invention is also presented for efficient heat dissipation. The method in the disclosed embodiments substantially includes the steps necessary to carry out the functions presented above with respect to the operation of the described apparatus and system. In one embodiment, the method includes providing a compliant heat pipe configured to conform to adjacent surfaces under a compressive load, providing a compression member configured to apply the compressive load to the compliant heat pipe, and applying the compressive load to the compliant heat pipe with the compression member, wherein the compliant heat pipe conforms to the surface of the compression member and the surface of a heat source under the compressive load.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

As used herein, the term "compliant" means compressibility, flexibility, or the ability to conform to adjacent surfaces. As used herein, the term "spring" means the physical property of resilience as would be quantified by the materials "spring constant." The term "spring" is not intended to mean the metal coiled structure commonly referred to as a spring.

Figure 2A:
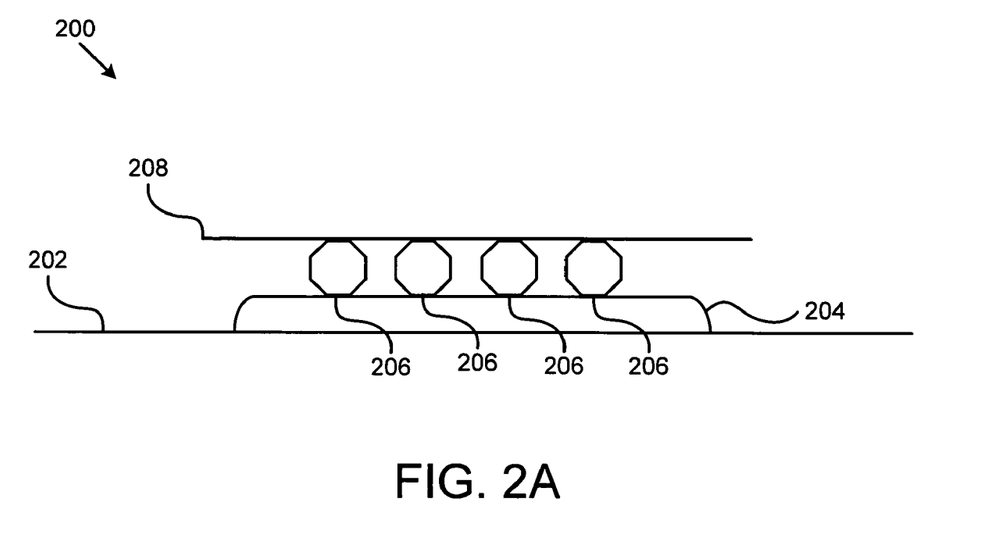
FIG. 2A is a cross-sectional front view of one embodiment of an apparatus for efficient heat dissipation.

FIG. 2A depicts a cross-sectional front view of one embodiment of an apparatus 200 for efficient heat dissipation. In one embodiment, the apparatus 200 includes one or more compliant heat pipes 206, a compression member 208, and a heat source 204. In a particular embodiment, the heat source 204 is mounted to a circuit board 202.

In one embodiment, the compliant heat pipe 206 is made from a flexible material such as rubber, plastic, metal, metal alloy or the like. Preferably, the compliant heat pipe 206 material is capable of withstanding high temperatures and pressure, and is both compliant and resilient. For example, the compliant heat pipe 206 may include a rubber compound capable of withstanding several hundred degrees and up to 100 psi of internal pressure. In such an example, the rubber compound may be flexible, conforming to adjacent surfaces. In one further embodiment, the compliant heat pipe 206 may have an octagonal cross section for more efficient heat dissipation and tighter conformity to adjacent surfaces. Specifically, the octagonal shape may provide a greater surface area available to the heat source 204 for heat transfer when the compliant heat pipe 206 is both compressed and uncompressed. The specifics of these benefits are described in further detail with relation to FIG. 2B.

In one embodiment, the compression member 208 provides a compressive load (described below with relation to FIG. 2B) to both facilitate heat exchange between the heat source 204 and the compressive heat pipe 206. Additionally, the compression member 208 may hold the compliant heat pipe 206 in place. In one embodiment, the compressive member 208 may include a clamp, a hook, a bracket, a hardware mount (i.e. a device for attaching such as a screw, bolt, or the like), and other devices for attaching and providing a compressive load on the compliant heat pipe 206. In a further embodiment, the compressive member may include a plate, a heat sink, or other rigid or semi-rigid surface for applying a compressive load on the compliant heat pipe 206. In a certain embodiment, the compressive member may apply a substantially uniform compressive load to the compliant heat pipe 206 across the area of the interface between the heat source 204 to compliant heat pipe 206.

Figure 2B:
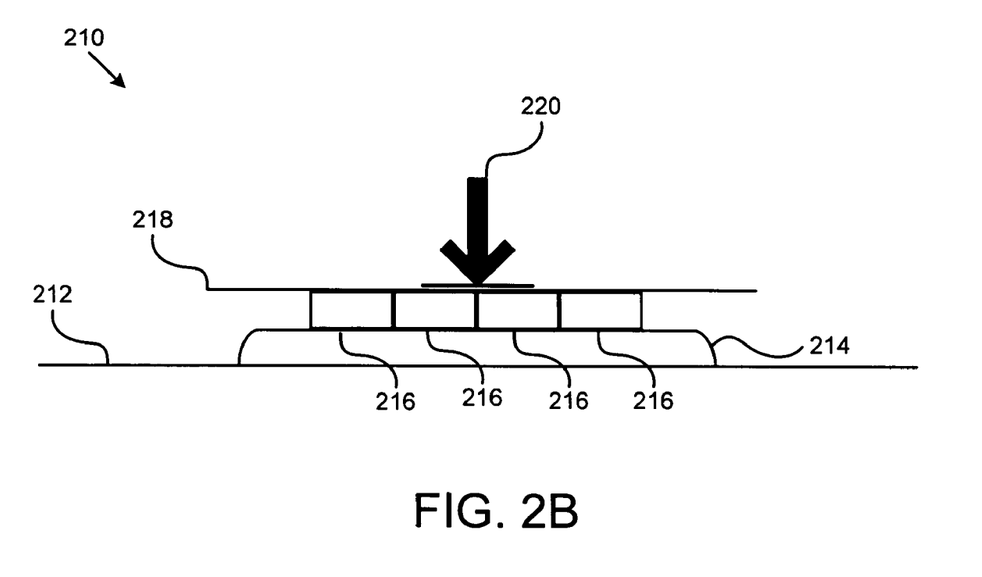
FIG. 2B is a cross-sectional front view of one embodiment of an apparatus for efficient heat dissipation under a compressive load.

FIG. 2B is a cross-sectional front view of one embodiment of an apparatus 210 for efficient heat dissipation under a compressive load 220. In such an embodiment, the apparatus 110 includes a compressive member 218 configured to apply a compressive load 220 to a compliant heat pipe 216. The compressive member 218 may facilitate heat exchange at the interface between the heat source 214 and the compliant heat pipe 216 by applying the compressive load 220 to the compliant heat pipe 216. In one embodiment, the heat source 214 and the compression member 218 may be mounted, affixed, or otherwise attached to a circuit board 212.

In a certain embodiment, the compressive load 220 may cause the compliant heat pipe 216 to conform to the surfaces of the compression member 218, the heat source 214 and any adjacent heat pipes 216. As the compliant heat pipe 216 is compressed, the heat pipe 216 may conform to a substantially rectangular cross-section, thereby substantially filling air gaps between adjacent compliant heat pipes 216 and between the compliant heat pipe 216 and the heat source 214. In one further embodiment, the compliant heat pipe 216 may substantially return the original cross-section shape when the compressive load 220 is released. For example, a compliant heat pipe 216 formed of a rubber compound may return to a substantially octagonal cross-section when the compressive load 220 is released.

In a further embodiment, the compliant heat pipe 216 provides spring required to facilitate the application of the compressive load 220 by the compression member 218. Beneficially, the spring provided by the compliant heat pipe 216 and resulting compressive load 220 may further facilitate heat exchange between the compliant heat pipe 216 and the heat source 214 by transferring the compressive load 220 to heat transfer grease or thermal grease at the interface between the compliant heat pipe 216 and the heat source 214 as described in further detail with relation to FIGS. 3A and 3B below.

Figure 3A:
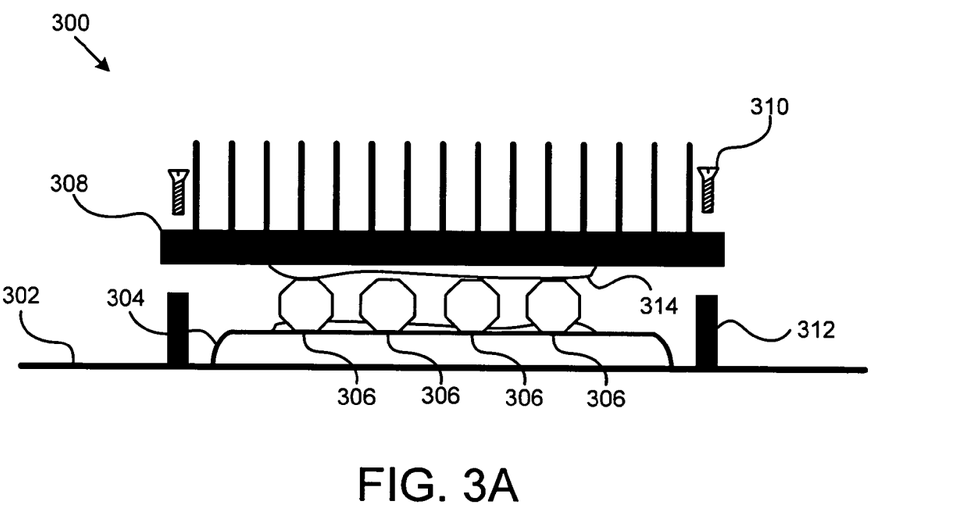
FIG. 3A is a cross-sectional front view of a system for efficient heat dissipation.

FIG. 3A is a cross-sectional front view of a system 300 for efficient heat dissipation. In one embodiment, the system 300 includes a heat source 304, a heat sink 308 configured to dissipate heat generated by the heat source, and a compliant heat pipe assembly. In one embodiment, the compliant heat pipe assembly may include one or more compliant heat pipes 306, and a compression member 208. In a further embodiment, the complaint heat pipe 306 conforms to the heat sink 308 and the surface of a heat source 304 under a compressive load 220. In a further embodiment, the system 300 may include thermal grease 314 and a circuit board 302.

In one embodiment, the heat sink 308 may include a base structure and a plurality of fins arranged to facilitate dissipation of heat to ambient air. In certain embodiments, the heat sink 308 may include any of the many configurations commonly known in the art. In one embodiment, the heat sink 308 may be specially configured to facilitate application of the compressive load 220 to the compliant heat pipe 306. In one embodiment, the heat sink 308 is a component of the compression member 218.

In one embodiment, the compression member 218 may include a hit sink 308. In another embodiment, the compression member 218 may include hardware components necessary to apply a compressive load on the compliant heat pipe 306. For example, the compression member 218 may include one or more screws 310 or bolts. In such an example, the screws 310 may screw into one or more threaded posts 312 or threaded receivers. In an alternative embodiment, the compression member 218 may include a clamp, a hook, or other components as described above with relation to FIG. 2A. In one particular embodiment, the compression member 218 may include a heat sink 308, a plurality of screws 310, and a plurality of threaded posts 312. In such an embodiment, the screws 310 may be captive to opening in the base of the heat sink 308. In such an embodiment, the screws 310 may be tightened until the compliant heat pipe 306 is compressed to a predetermined load value. For example, the screws 310 may be tightened until a compressive load 220 of between 10 psi and 40 psi is imposed on the compliant heat pipe 306 and the thermal grease 314.

In one embodiment, thermal or heat transfer grease 314 may be applied to the interface between the heat sink 308 and the compliant heat pipe 314 to facilitate efficient heat transfer between the surfaces of the two components. In a further embodiment, the thermal grease 314 may be applied to the interface between the heat source 304 and the compliant heat pipe 306. In additional embodiments, the thermal grease 314 may be applied to both interfaces. In such embodiments, the thermal grease 314 facilitates efficient heat transfer and dissipation by substantially filling air gaps between the heat source 304 and the compliant heat pipe 306, between the heat sink 308 and the compliant heat pipe 306, and between a plurality of compliant heat pipes 306. Beneficially, the spring provided by the compliant heat pipe 306 may facilitate application of compressive load to the thermal grease 314 needed for the thermal grease 314 to function efficiently.

Figure 3B:
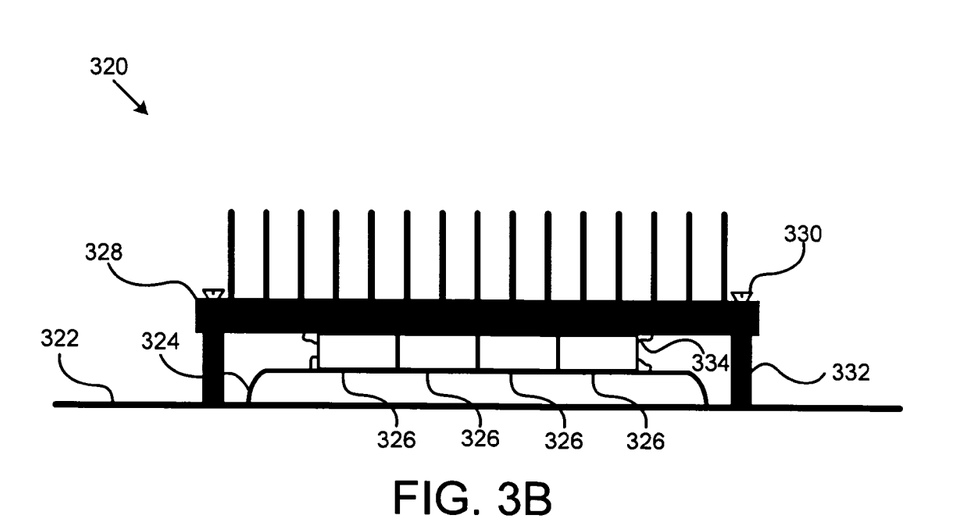
FIG. 3B is a cross-sectional front view of a system for efficient heat dissipation under a compressive load.

FIG. 3B is a cross-sectional front view of a system 310 for efficient heat dissipation under a compressive load 220. In one embodiment, the compression member 218 may provide a compressive load 220 to the compliant heat pipe 326. In the depicted embodiment, the compression member 218 includes the heat sink 328, a plurality of screws 330 and a plurality of threaded posts 332, however one of ordinary skill in the art may recognize a variety of configurations for a compression member 218 that may provide the compressive load 220. In one embodiment, the complaint heat pipes 326 conform from an octagonal cross-section as depicted by compliant heat pipes 306 in FIG. 3A to a substantially rectangular cross-section as depicted by compressed compliant heat pipes 326. In such an embodiment, the compressed compliant heat pipes 326 conform to the surfaces of the heat sink 328 and the heat source 324. Additionally, where multiple compliant heat pipes 326 are used, the compressed compliant heat pipes 326 may additionally conform to the surfaces of the adjacent compliant heat pipes 326. In another embodiment, where compliant heat pipes 306 with a substantially round cross-section are used, the compressed compliant heat pipes 326 may conform to a substantially oval cross-section, or a substantially rectangular cross-section with rounded corners.

The schematic flow chart diagrams that follow are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Figure 4:
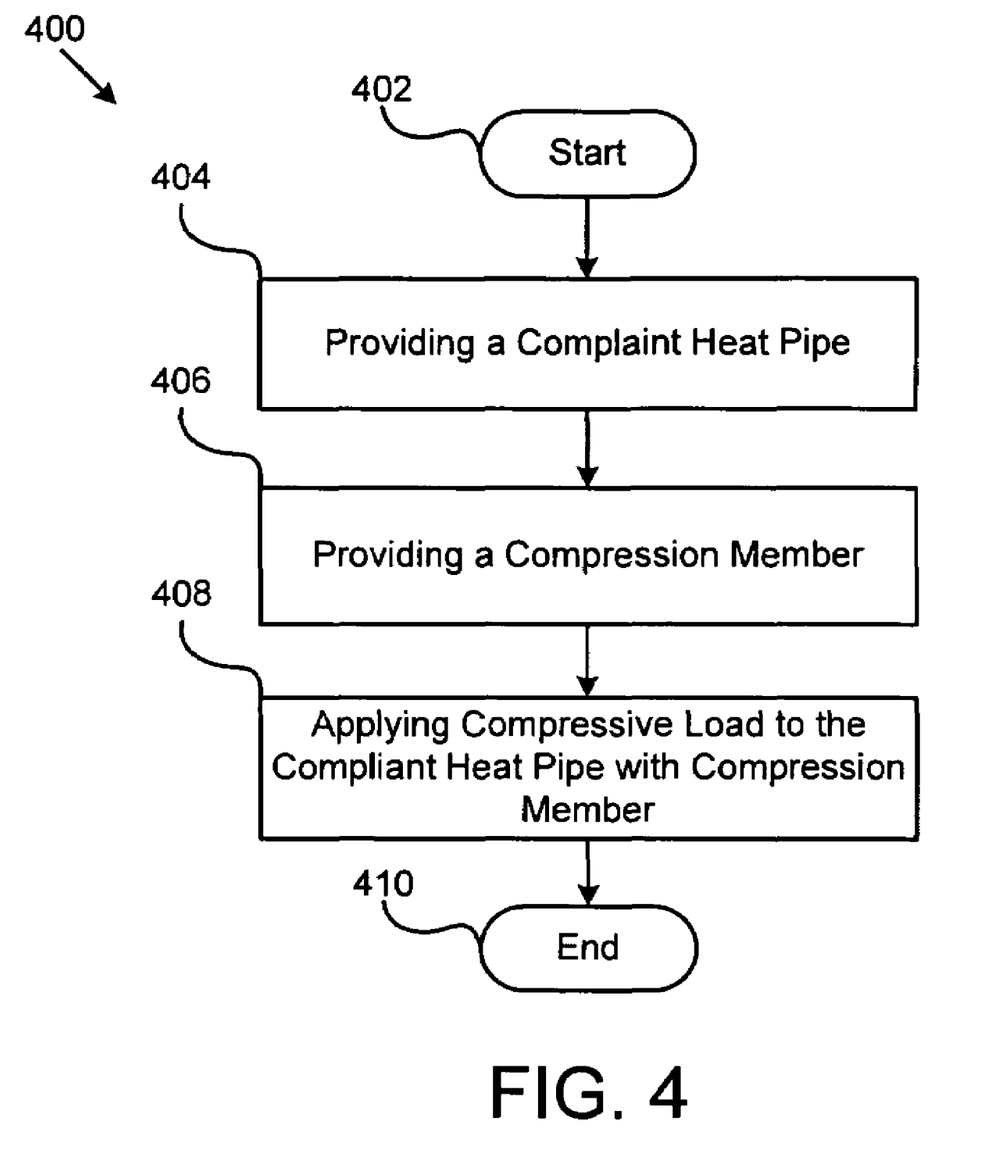
FIG. 4 is a schematic flow chart diagram illustrating one embodiment of a method for efficient heat dissipation.

FIG. 4 is a schematic flow chart diagram illustrating one embodiment of a method 400 for efficient heat dissipation. In one embodiment, the method 400 starts 402 with providing 404 a compliant heat pipe 216 configured to conform to adjacent surfaces under a compressive load 220. The method 400 may further include providing 406 a compression member 218 configured to apply the compressive load 220 to the compliant heat pipe 216. In a further embodiment, the method 400 includes applying 408 the compressive load 220 to the compliant heat pipe 216 with the compression member 418, wherein the compliant heat pipe 216 conforms to the surface of the compression member 218 and the surface of the heat source 214 under the compressive load 220 and the method 400 ends 410.

For example, the method 400 may include providing 404 a compliant heat pipe 306 formed from an octagonal copper or copper alloy pipe. The method 400 may further include providing 406 a heat sink 308 with captured hardware 310. In such an example, the method 400 includes applying 408 a compressive load 220 to the complaint heat pipe 306 with the bottom surface of the heat sink 308 and the captured hardware 310, wherein the octagonal compliant heat pipe 306 conforms to the bottom surface of the heat sink 308, the top surface 304 and the side surfaces of any adjacent compliant heat pipes 306.

Figure 5:
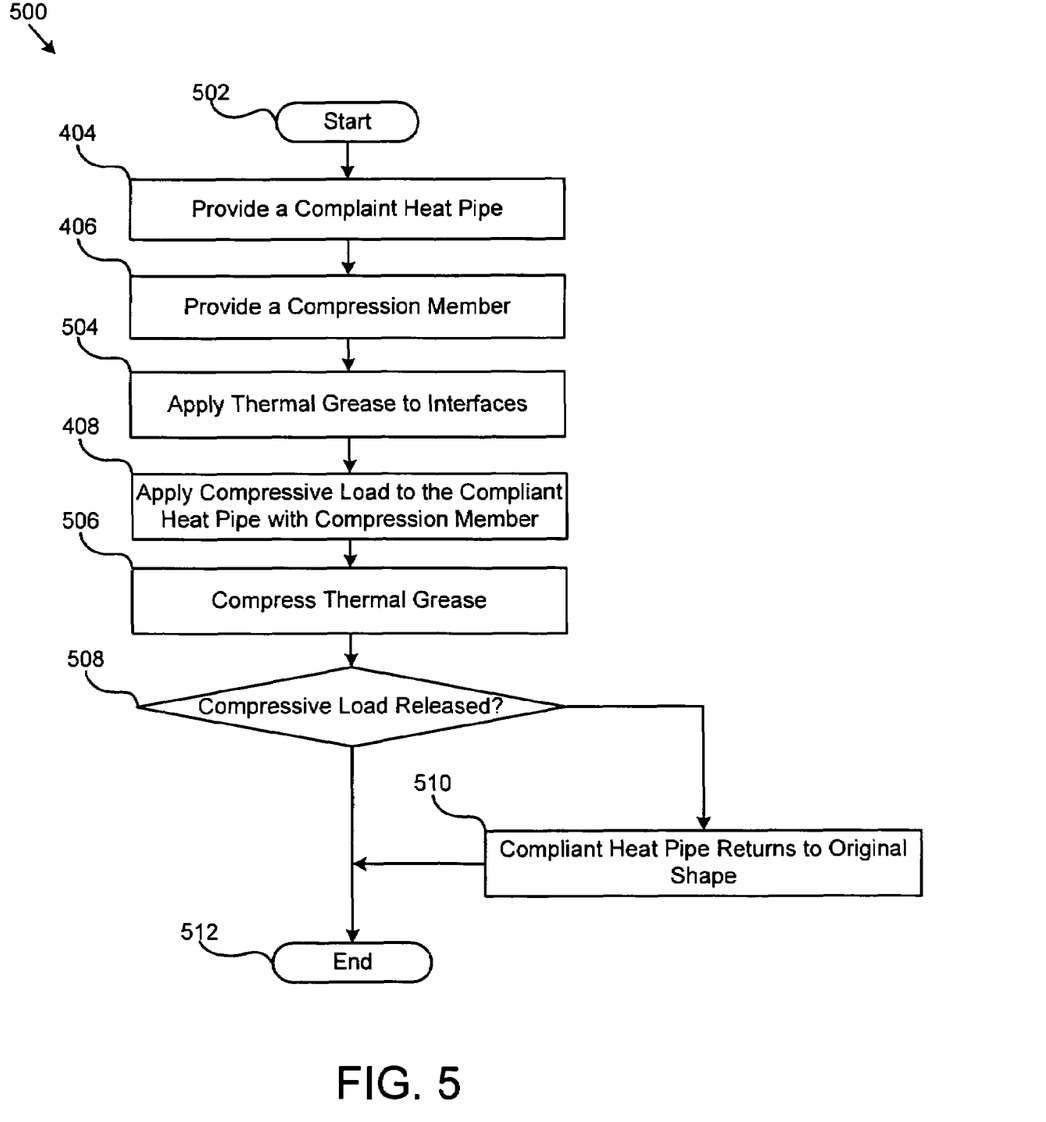
FIG. 5 is a detailed schematic flow chart diagram illustrating one embodiment of a method for efficient heat dissipation.

FIG. 5 is a detailed schematic flow chart diagram illustrating one embodiment of a method 500 for efficient heat dissipation. The method 500 starts 502 with providing 404 a compliant heat pipe 326 and providing 406 a compression member 218. In one embodiment, the method 500 also includes applying 504 thermal grease 334 to the interface surfaces between the compression member 218 and the compliant heat pipe 326 and between the heat source 324 and the compliant heat pipe 326. In one further embodiment, the method 500 includes applying 408 a compressive load 220 to the complaint heat pipe 326 with the compression member 228. In another embodiment, the method 500 may include compressing 506 the thermal grease 334 through spring provided by the compliant heat pipe 326. For example, the compressive load 220 applied to the thermal grease may be quantified using the value of the pressure exerted on the compliant heat pipe 326 and the spring constant exhibited by the compliant heat pipe 326.

In a further embodiment, the method 500 may additionally include releasing the compressive load 220 and removing or replacing the complaint heat pipe 326. If the compressive load is released 508, the compliant heat pipe 326 may substantially return 510 to its original shape 306, and the method 500 ends 512. Alternatively, the compliant heat pipe 326 may remain compressed for an undetermined duration.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus for efficient heat dissipation, the apparatus comprising:
    a plurality of compliant heat pipes configured to conform to adjacent surfaces under a compressive load, the compliant heat pipes each comprising an outer contact surface; and
    a compression member configured to apply the compressive load to the compliant heat pipes;
    wherein the outer contact surfaces of the compliant heat pipes deform against the compression member, a surface of a heat source, and adjacent compliant heat pipes under the compressive load such that the compliant heat pipes conform to the surface of the compression member, the surface of the heat source, and the outer contact surface of adjacent compliant heat pipes.

2. The apparatus of claim 1, wherein each compliant heat pipe is further configured to facilitate application of the compressive load to heat transfer grease at the interface of the heat source and the compliant heat pipe.

3. The apparatus of claim 1, wherein each compliant heat pipe further comprises a substantially octagonal pipe.

4. The apparatus of claim 3, wherein each compliant heat pipe is further configured to conform to the surface of the compression member and the surface of a heat source taking on a substantially rectangular cross-section when under the compressive load.

5. The apparatus of claim 1, wherein each compliant heat pipe is further configured to substantially return to an original shape when the compressive load is released.

6. The apparatus of claim 1, wherein compressive member is further configured to apply the compressive load to the compliant heat pipes across the area of the interface between the compliant heat pipes and the heat source.

7. The apparatus of claim 1, wherein each compliant heat pipe is configured to contain a fluid configured to circulate heat within the compliant heat pipe.

8. A system for efficient heat dissipation, the system comprising:
    a heat source;
    a heat sink configured to dissipate heat generated by the heat source; and a compliant heat pipe assembly comprising;
  a plurality of a compliant heat pipe configured to conform to adjacent surfaces under a compressive load; and
  a compression member configured to apply the compressive load through a heat sink interface surface to the compliant heat pipes;
  wherein the compliant heat pipes each comprise an outer contact surface contactable with the heat sink interface surface, a surface of the heat source, and adjacent compliant heat pipes, and wherein the outer contact surface is deformable under the compressive load such that the compliant heat pipes conform to the heat sink interface surface, the surface of the heat source and the outer contact surface of adjacent compliant heat pipes.

9. The system of claim 8, further comprising thermal grease applied to at least one interface selected from the group of interfaces consisting of the interface between the compliant heat pipes and the heat sink interface surface and the interface between the compliant heat pipes and the heat source.

10. The system of claim 9, wherein the compliant heat pipes are further configured to facilitate application of the compressive load to the thermal grease.

11. The system of claim 8, wherein the compliant heat pipes further comprise a substantially octagonal pipe.

12. The system of claim 11, wherein the compliant heat pipes conform to a substantially rectangular cross-section when under the compressive load.

13. The system of claim 8, wherein the compliant heat pipes are further configured to substantially return to an original shape when the compressive load is released.

14. The system of claim 8, wherein the compressive member is further configured to apply the compressive load to the compliant heat pipes across the interface area between the compliant heat pipes and the heat source.

15. A method for efficient heat dissipation, the method comprising:
  providing a plurality of compliant heat pipes configured to conform to adjacent surfaces under a compressive load, the plurality of compliant heat pipes each comprising a compression member contact surface, a heat source contact surface, and at least one adjacent compliant heat pipe surface, wherein a portion of the compression member contact surface is contactable with the compression member, a portion of the heat source contact surface is contactable with the heat source, and a portion of the at least one adjacent compliant heat pipe surface is contactable with at least one adjacent compliant heat pipe surface;
  providing a compression member configured to apply the compressive load to the compliant heat pipes; and
  deforming the compression member contact surface of each of the plurality of compliant heat pipes to increase the area of the compression member contact surface in contact with the compression member, deforming the heat source contact surface of each of the plurality of compliant heat pipes to increase the area of the heat source contact surface in contact with the heat source, and deforming the at least one adjacent compliant heat pipe surface of each of the plurality of compliant heat pipes into contact with at least one adjacent compliant heat pipe by applying the compressive load to the compliant heat pipes with the compression member.

16. The method of claim 15, further comprising applying thermal grease to at least one interface selected from the group of interfaces consisting of the interface between the compliant heat pipes and the heat sink interface surface and the interface between the compliant heat pipes and the heat source.

17. The method of claim 16, further comprising facilitating application of the compressive load to the thermal grease through spring provided by the compliant heat pipes.

18. The method of claim 15, wherein the compliant heat pipes conform to the surface of the compression member and the surface of a heat source, and wherein the compliant heat pipes conform to a substantially rectangular cross-section when under the compressive load.

19. The method of claim 15, wherein the compliant heat pipes substantially return to an original shape when the compressive load is released.

20. The method of claim 15, further comprising applying the compressive load to the compliant heat pipes across the interface area between the compliant heat pipes and the heat source.

* * * * *